United States Patent [19]

Andrews

[11] Patent Number: 5,640,188
[45] Date of Patent: Jun. 17, 1997

[54] MULTIPLE DIODE LASER EMPLOYING MATING SUBSTRATES

[75] Inventor: John R. Andrews, Fairport, N.Y.

[73] Assignee: Xerox Corporation, Stamford, Conn.

[21] Appl. No.: 992,686

[22] Filed: Dec. 18, 1992

[51] Int. Cl.$^6$ .............. B41J 2/385; B41J 2/455; B41J 2/47; H01S 3/043
[52] U.S. Cl. .............. 347/130; 347/238; 347/245; 372/36
[58] Field of Search .............. 346/107 R, 108; 372/36, 109; 400/175; 347/238, 243, 245, 233, 130, 138, 129, 49

[56] References Cited

U.S. PATENT DOCUMENTS

| | | | |
|---|---|---|---|
| 3,878,556 | 4/1975 | Nyul | 372/36 |
| 4,293,826 | 10/1981 | Scifres et al. | 331/945 |
| 4,393,387 | 7/1983 | Kitamura | 346/108 |
| 4,404,571 | 9/1983 | Kitamura | 346/108 |
| 4,474,422 | 10/1984 | Kitamura | 350/6.8 |
| 4,536,778 | 8/1985 | DeSchamphelaere et al. | 347/130 |
| 4,660,059 | 4/1987 | O'Brien | 346/157 |
| 4,791,452 | 12/1988 | Kasai et al. | 355/14 D |
| 4,884,857 | 12/1989 | Prakash et al. | 350/6.8 |
| 4,892,371 | 1/1990 | Yamada et al. | 350/6.8 |
| 4,901,325 | 2/1990 | Kato et al. | 372/44 |
| 4,903,067 | 2/1990 | Murayama et al. | 346/160 |
| 4,924,321 | 5/1990 | Miyagawa et al. | 346/108 X |
| 4,956,684 | 9/1990 | Urata | 346/107 R X |
| 5,022,035 | 6/1991 | Hasegawa | 372/36 |
| 5,060,237 | 10/1991 | Peterson | 372/50 |
| 5,119,114 | 6/1992 | Cary | 346/139 R |
| 5,148,194 | 9/1992 | Asai et al. | 400/175 X |

*Primary Examiner*—Benjamin R. Fuller
*Assistant Examiner*—David Yockey
*Attorney, Agent, or Firm*—Duane C. Basch

[57] ABSTRACT

The present invention is a multiple spot laser assembly, comprising a plurality of laser diodes, and a plurality of mounts, which include a support surface, upon which the laser diode are permanently affixed. The mounts, including the base plate and/or heat sink, further include a mating feature along an edge thereof for aligning a first mount with an adjacent mount, the two mounts abutting along at least one common edge. The mating features assure the accurate alignment of the laser diodes on the adjacent mounts when the mounts are assembled into a multispot laser light source.

12 Claims, 5 Drawing Sheets

MULTIPLE DIODE LASER EMPLOYING MATING SUBSTRATES

This invention relates generally to a raster output scanning apparatus for a printing machine, and more particularly to multibeam laser produced from a plurality of laser diodes.

CROSS REFERENCE

The following related applications are hereby incorporated by reference for their teachings:

U.S. patent application Ser. No. 07/948,530, now U.S. Pat. No. 5,371,526, to James Appel et al., entitled "A Raster Output Scanner for a Multi-Station Xerographic Printing System Having Laser Diodes Arranged In a Line Parallel to the Fast Scan Direction", filed Sep. 22, 1992;

U.S. patent application Ser. No. 07/948,531, now U.S. Pat. No. 5,343,224, to Thomas L. Paoli, entitled "Diode Laser Multiple Output Scanning System", filed Sep. 22, 1992;

U.S. patent application Ser. No. 07/928,511, now U.S. Pat. No. 5,197,708, to John R. Andrews, entitled "Raster Output Scanning Arrangement for a Printing Machine", filed Sep. 22, 1992; and U.S. patent application Ser. No. 07/992,681, now U.S. Pat. No. 5,432,535, to John R. Andrews et al., entitled "Method and Apparatus for Fabrication of Multibeam Lasers", filed concurrently herewith.

BACKGROUND AND SUMMARY OF THE INVENTION

The present invention is directed to flying spot scanners (commonly referred to as raster output scanners (ROSs)) which typically have a reflective multifaceted polygon mirror that is rotated about its central axis to repeatedly sweep one or more intensity modulated beams of light across a photosensitive recording medium in a line (fast) scanning direction. While the beams sweep across the photosensitive recording medium, it is advanced in an orthogonal, or "process", direction, commonly referred to as the slow-scan direction, such that the beams scan the recording medium in accordance with a raster scanning pattern. Digital printing is performed by serially modulating the intensity of each of the beams in accordance with a binary sample stream, whereby the recording medium is exposed to the image represented by the samples as it is being scanned.

Printers that sweep several beams simultaneously are referred to as multibeam or multispot printers. Moreover, dual or multispot lasers are considered to be an enabling technology for high speed printers operating at resolutions of about 600 spots per inch (spi) while producing output at greater than 80 pages per minute (ppm). Monolithic laser arrays, while providing the multispot capability, have typically been strongly sensitive to thermal crosstalk when used in closely spaced lasers having interbeam spacings of less than 250 µm, and are not easily adapted to provide multiple wavelength and/or multiple polarity laser beams.

The following disclosures relate to both ROS printing devices and multibeam laser diodes which may be relevant:

U.S. Pat. No. 5,060,237

Patentee: Peterson

Issued: Oct. 22, 1992

U.S. Pat. No. 4,901,325

Patentee: Kato et al.

Issued: Feb. 13, 1990

U.S. Pat. No. 4,892,371

Patentee: Yamada et al.

Issued: Jan. 9, 1990

U.S. Pat. No. 4,884,857

Patentee: Prakash et al.

Issued: Dec. 5, 1989

U.S. Pat. No. 4,474,422

Patentee: Kitamura

Issued: Oct. 2, 1984

U.S. Pat. No. 4,404,571

Patentee: Kitamura

Issued: Sep. 13, 1983

U.S. Pat. No. 4,393,387

Patentee: Kitamura

Issued: Jul. 12, 1983

U.S. Pat. No. 4,293,826

Patentee: Scifres et al.

Issued: Oct. 6, 1981

The relevant portions of the foregoing disclosures may be briefly summarized as follows:

U.S. Pat. No. 5,060,237 discloses a laser diode array including a plurality of laser diode bodies affixed to a surface of a substrate. Each of the laser bodies includes a semiconductor junction therein which is capable of generating light in response to a voltage potential. An end surface of the body is angled at a forty-five degree angle so as to reflect the light generated by the diode in a direction which is orthogonal to the surface of the substrate.

U.S. Pat. No. 4,901,325 teaches a semiconductor laser device used in an optical disk device which utilizes a pair of semiconductor laser chips and a fixing device for fixing the laser chips so that the electrode surfaces are approximately parallel and opposite to each other. The fixing device comprises either a single-piece, U-shaped block or, alternatively, a pair of blocks, upon which the photodiodes are ultimately mounted.

U.S. Pat. No. 4,892,371 describes a semiconductor laser array light source and scanner wherein the laser light source emits one or more pairs of light beams. The light beams are collimated by a collimating lens and are subsequently directed along separate paths. Additional optical means are used to transmit or reflect certain of the light beams to one or more incident surfaces of the optical means so as to align the beams by controlling the angle of incidence and beam separation at a photosensitive surface.

U.S. Pat. No. 4,884,857 teaches a multiple spot printer which employs a laser system having multiple semiconductor lasers, an aperture plate, and an optical system as shown in FIGS. 4 and 5. Control of the spot locations at the surface of the photoconductor is achieved in two planes, first, using an aperture plate in the process plane, and second, using a single aperture plate in the scan plane.

U.S. Pat. No. 4,474,422 discloses an optical scanning apparatus having a light source consisting of an array of aligned light sources. The beams from the light sources are collimated and deflected to sweep across a single photoreceptor. The beams are also displaced from each other in the cross-scan direction so that multiple lines can be scanned simultaneously across the photoreceptor. An object of U.S. Pat. No. 4,474,422 is to reduce variations in pitch by closely spacing individual lasers within the laser array in a compact structure.

U.S. Pat. No. 4,404,571 describes a multibeam recording apparatus comprising a scanner for scanning a recording medium with a plurality of light beams and a beam detector. The scanner employs a laser array light source having a plural number of semiconductor lasers arranged in a row. The beam detector utilizes a screen plate with a detection aperture which is smaller than the inter-beam spacing to individually detect each of the plural beams.

U.S. Pat. No. 4,393,387 teaches a beam recording apparatus including a semiconductor array laser light source having a plurality of light beam emitting points, a condensing optical system, an image rotator, and a rotatable polygon mirror for deflecting the light beams to the surface of a photosensitive drum. High density recording is enabled by controlling the angle of incidence, and therefore the inter-beam spacing, of the outermost beams at the surface of the photosensitive drum.

U.S. Pat. No. 4,293,826 discloses a semiconductor injection laser having an optical feedback control incorporated within the same semiconductor chip. Stabilization of the of the laser output is accomplished by monitoring a portion of the light output with an optical detector, which then drives a feedback circuit to control the laser current. The patent further describes a hybrid semiconductor laser/detector arrangement which implements an array of laser/detector pairs on a single semiconductor substrate.

The pertinent portions of the above-cited references are hereby incorporated by reference for their teachings.

In accordance with the present invention, there is provided a multiple spot laser assembly, comprising; a plurality of laser diodes; a plurality of mounting means, each including a support surface having one of said laser diodes affixed thereto; and means for aligning said mounting means with an adjacent one of said mounting means.

In accordance with another aspect of the present invention, there is provided a printing machine having a photoresponsive member which is exposed by a raster output scanning arrangement. The raster output scanning arrangement comprises: a multiple spot laser which includes a first laser diode for producing a first beam, a second laser diode for producing a second beam, first and second mounting means, each having support surfaces with said first and second diodes, respectively, affixed thereto, and means for aligning said first mounting means with respect to said second mounting means; means for deflecting the first and second beams into an optical path; and means for directing said first and second beams toward the surface of the photoresponsive member.

The present invention will be described in connection with a preferred embodiment, however, it will be understood that there is no intent to limit the invention to the embodiments described. On the contrary, the intent is to cover all alternatives, modifications, and equivalents as may be included within the spirit and scope of the invention as defined by the appended claims. For example, the present invention may very well be employed to achieve a semiconductor laser for use in an optical disk device similar to that described by Kato et al. in U.S. Pat. No. 4,901,325, the relevant portions of which are hereby incorporated by reference.

DESCRIPTION OF THE PREFERRED EMBODIMENT

Figure 1:
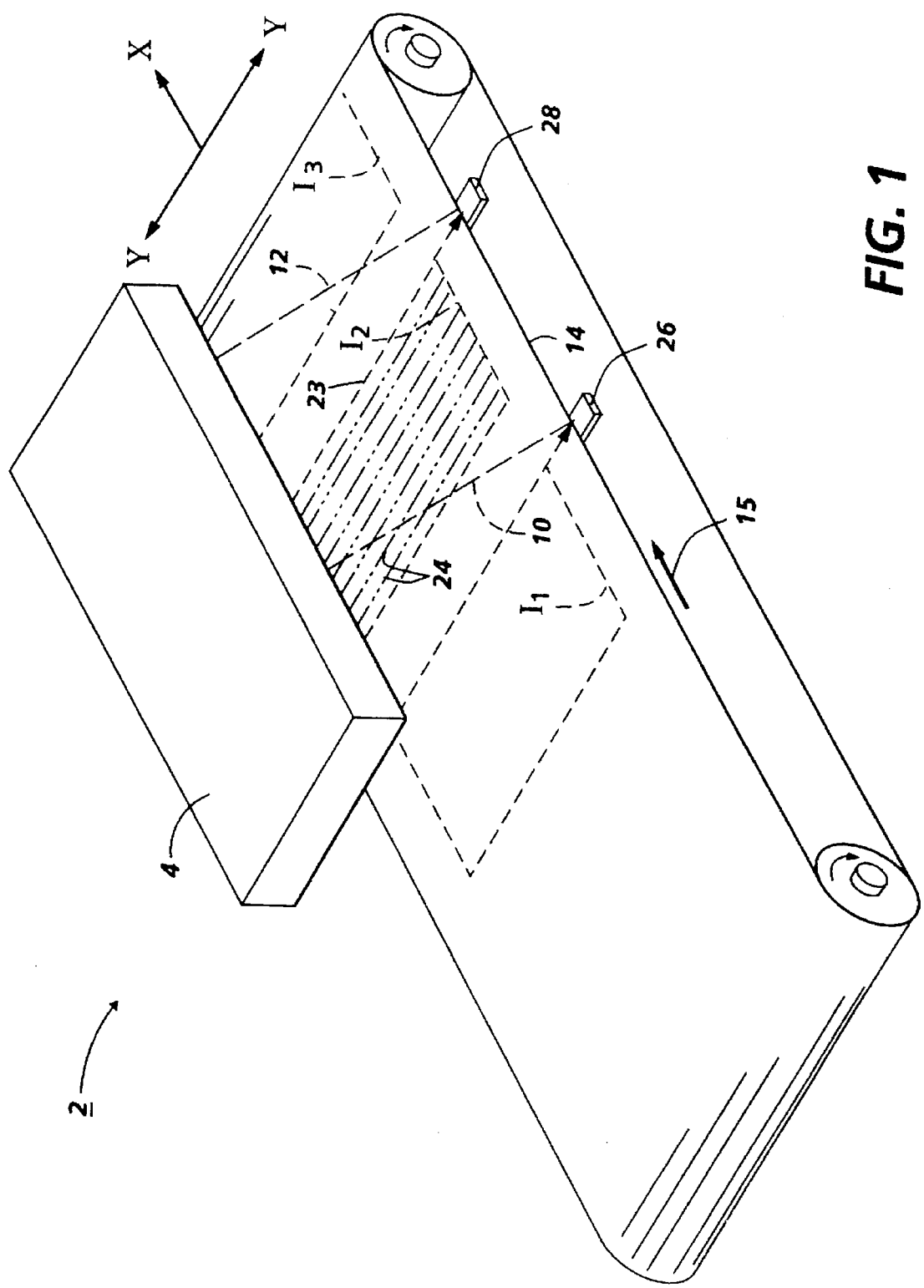
FIG. 1 shows a single-pass ROS color printing system with a housing incorporating a dual beam raster output scanning system.

For a general understanding of the present invention, reference is made to the drawings. In the drawings, like reference numerals have been used throughout to designate identical elements. FIG. 1 shows a single-pass ROS color printing system 2, which includes a ROS housing 4. As depicted, system 2 produces two separate output scanning beams, 10 and 12, although it is understood that a multibeam system, having greater than two beams, would have a similar configuration. System 2 further includes a photoreceptor belt 14, driven in the process direction, indicated by the arrow 15. The length of belt 14 is designed to accept an integral number of spaced image areas $I_1$–$I_n$ represented by dashed line rectangles in FIG. 1. Upstream of each exposure station are charge devices (not shown) which place a predetermined electrical charge on the surface of belt 14. As the belt moves in the indicated direction, each image area is scanned by a succession of scan lines to provide an image exposure pattern in response to image data signals which are input to the respective ROSs. The exposure pattern begins when the leading edge of image area 23 reaches a transverse start-of-scan line represented by dashed arrow 20. The exposure pattern is formed of a plurality of closely spaced transverse scan lines 24 shown with exaggerated longitudinal spacing on image area $I_2$. Downstream from each exposure station, development systems develop a latent image of the last exposure without disturbing previously developed images. A fully developed color image is then transferred by means not shown to an output sheet. System 2 may be a two color (highlight plus black) printer, although the plural beams emitted from ROS housing 4 may similarly be used to expose a single image area, thereby providing increased writing speed and/or increased writing density to a single image area, $I_n$, as described in the previously incorporated patents, for example, U.S. Pat. No. 4,474,422 to Kitamura. Further details of the operation of xerographic stations in a multiple exposure, single-pass system are disclosed in U.S. Pat. No. 4,660,059 to O'Brien and U.S. Pat. No. 4,791,452 to Kasai et al., the relevant portions of which are hereby incorporated by reference.

Further depicted in FIG. 1 are pairs of beam steering sensors 26 and 28, which used to sense the location of the scan lines as they traverse the surface of the photoreceptor. The sensor heads may also be used as start-of-scan (SOS) sensors, to determine the time at which the laser beam traverses a specific point, the occurrence of this event being used to synchronize the start-of-scan locations for each of the individual image frames, $I_1$–$I_n$, thereby registering the frames in the fast-scan, or Y, direction.

Figure 2:
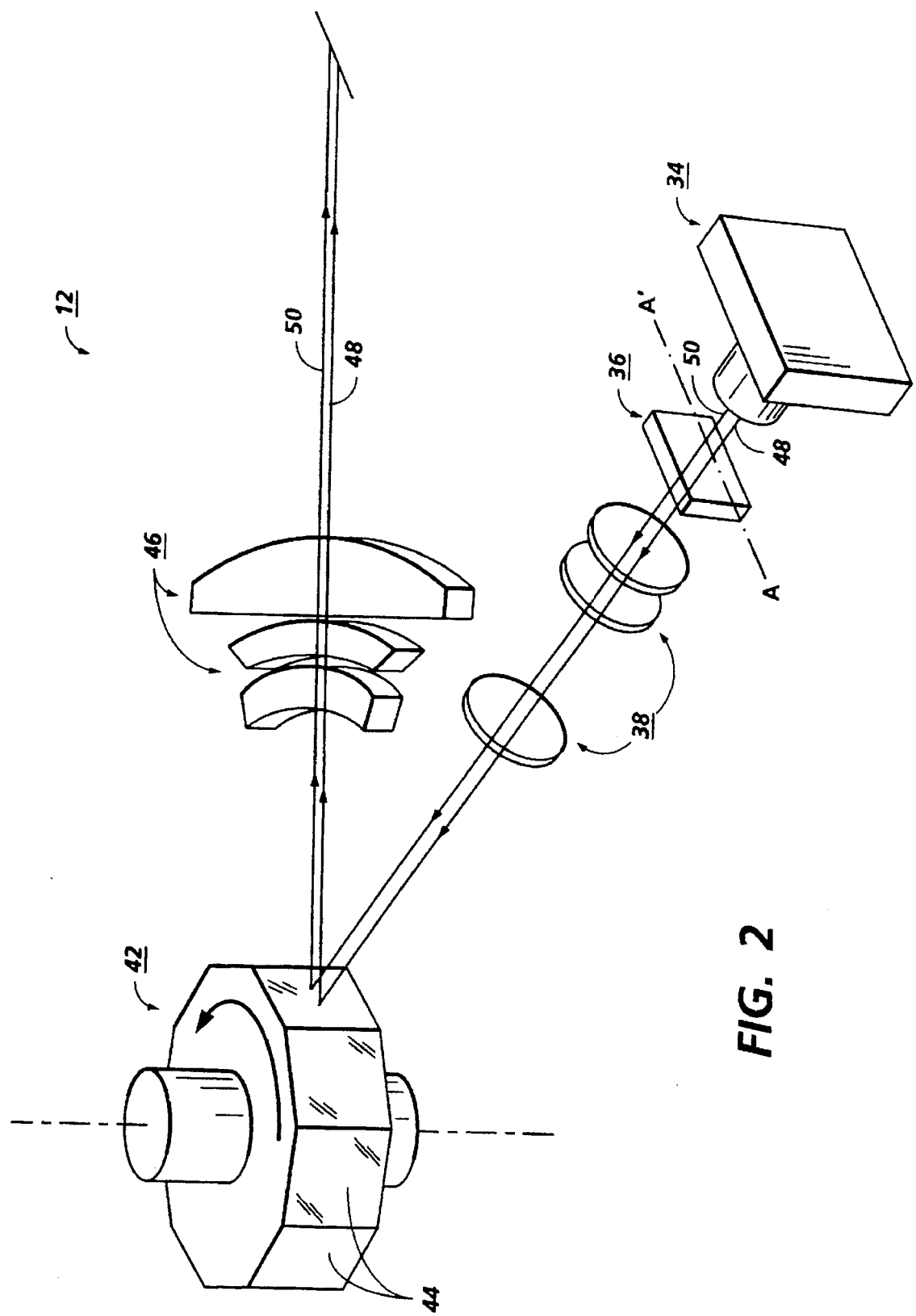
FIG. 2 is a perspective view illustrating the optical elements incorporated within another dual beam ROS, namely a light source, polarization control system, beam forming optics system, deflector and corrective optical system.

Referring to FIG. 2, the illustrated ROS system employs a light generating device 34, which, as shown in the following figures can comprise a plurality of relatively closely spaced laser diodes, 56. Typically, the laser diodes are separated from one another by a distance which is preferably less than or equal to 250 μm. In one example, the light generating device emits two laser beams 48 and 50, which may have different wavelengths, for example, 650 nm and 685 nm, respectively. As is apparent from the cross referenced applications, specifically, U.S. patent application Ser. No. 07/928,511 by John R. Andrews, the ROS arrangement of the present invention can be practiced with more than two laser beams, while the respective wavelengths and/or respective polarizations of the employed beams can be altered significantly without affecting the concept upon which the present invention is based. For purposes of clarity, in various drawings of the present application, only the chief rays of the beams 48 and 50 are shown. Light generating device 34 effectively provides a substantially common spatial origin for each beam. Each beam is independently modulated so that it exposes the photoreceptor in accordance with a respective digitized image.

Still referring to FIG. 2, the laser beams from device 34 are input to a segmented waveplate 36, and then optics system 38, which preferably includes a collimator lens to direct the beams onto an optical path such that they illuminate the deflector 42, which, in one example, comprises a rotating polygon mirror having a plurality of facets 44. As the polygon mirror rotates, the facets cause the reflected beams to deflect repeatedly for input to the correction optical system 46, which focuses the beams and corrects for errors such as polygon angle error and wobble prior to transmitting the beams to the surface of the photoreceptor.

Figure 3:
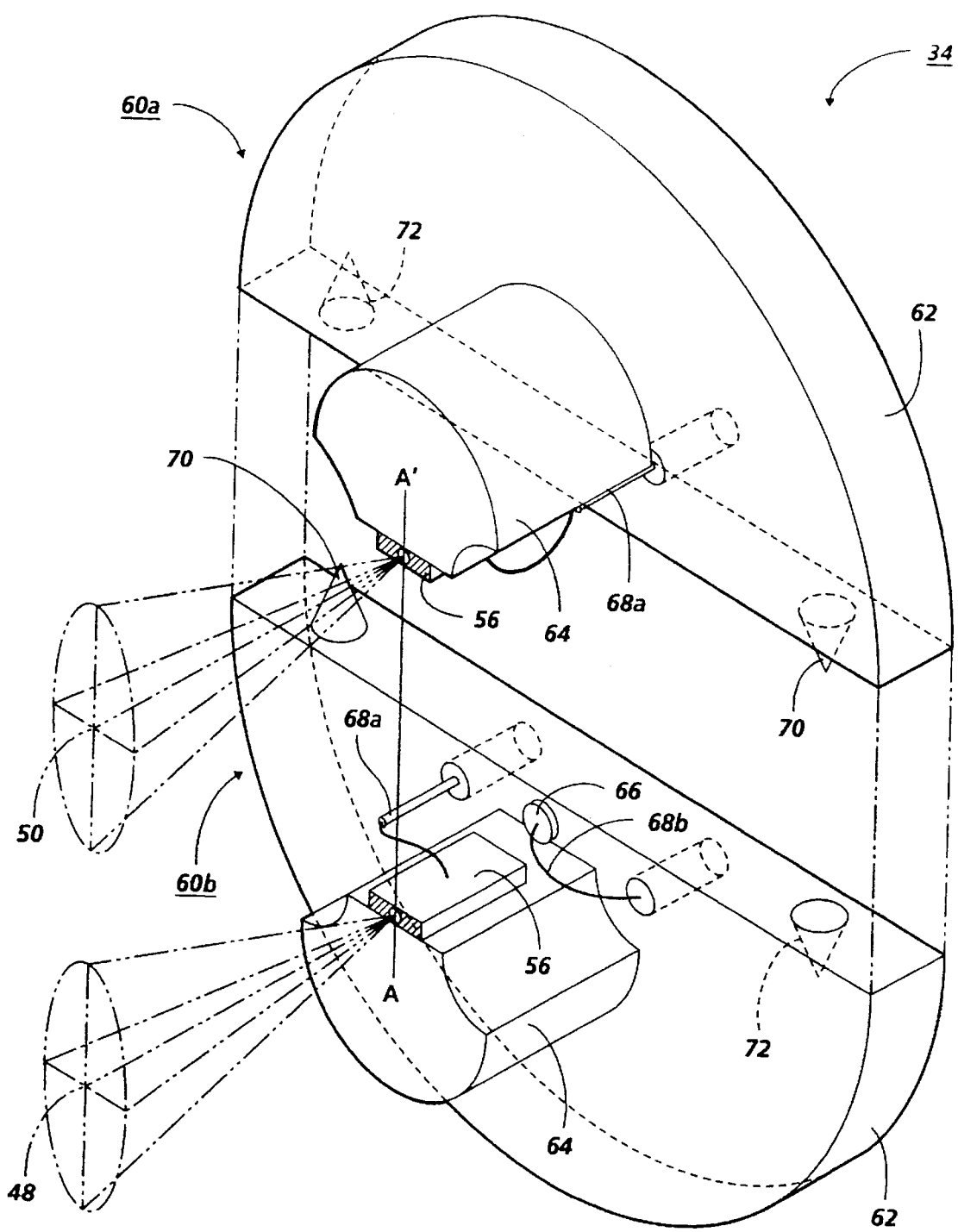
FIG. 3 is a perspective view of the light source of FIG. 2 illustrating one embodiment of the present invention.

Turning now to FIG. 3, where the dual spot embodiment of light generating device 34 is shown, the dual spot laser assembly illustrated is comprised of two identical halves. The halves, or mounts 60a,b are separable pieces which interlock to provide precise alignment of laser diodes 56 affixed thereto. The laser diodes may be any commonly available single-beam solid state laser diode, for example, the Toshiba 9211 VLD and dual or multispot monolithic semiconductor diodes may be used for laser diodes 56. Mounts 60a,b are are comprised of a base plate 62 and a heat sink 64. While shown as two distinct elements, where the heat sink is attached to a surface of the base plate, it is conceivable that the base and heat sink be machined from a single billet to produce the illustrated structure. Furthermore, heat sink 64 has a flat surface, orthogonal to the plane of the base plate, upon which the laser diode 56 is permanently affixed. The heat sink and base are preferably formed from a thermally conductive material, such as copper, thereby providing heat dissipation and and an electrical path via contact with the junction side of the laser diode. Instead of the commonly known circular base used in conventional laser light sources, the present embodiment utilizes two semicircular base plates having alignment features for aligning the two halves during assembly. Also included in mounts 60a,b, are sealed through-plate conductors, 68, suitable for carrying electrical signals through the base plate. For example, conductors 68a supply power to laser diode 56, while conductors 68b provide electrical power to, and return electrical signals from, photodetector 66. All conductors are wire bonded to contacts on the laser diodes and the photodetectors, thereby providing electrically conductive paths for connection to external laser driving and feedback circuitry (not shown).

Following assembly, the two mounts 60a,b would be permanently joined to one another, possibly using a welded or low temperature Indium compression bond or even an epoxy bond. Alternatively, a low temperature Indium alloy solder may be used to connect the base plates, while a higher temperature Indium-Lead solder may be used to affix the laser diode to the heat sink. Soldering the two mounts to produce a metal seal therebetween would enable the further addition of an organic-free hermetic seal of the laser light generating device when a windowed cap is put in place, as is commonly practiced in the laser industry, to complete packaging. To further prevent potential contact and shorting of the conductors, 68a, which supply power to the two lasers, during assembly of the halves a small spacer could be placed between the two lasers, and then removed prior to placing the windowed cap over the entire assembly. Since the individual lasers are on the order of 70 μm thick, measured along the A–A' line, the two wirebonds are intended to be made to fit into a separation between the top laser surfaces of 110 μm resulting in a laser spacing of 250 μm. As further depicted in the figure, complimentary cone-shaped projections and depressions, 70 and 72, respectively, are used as the alignment features for the two semicircular mounts. Once aligned and assembled, laser diodes 56 produce two parallel light beams, indicated by reference numerals 48 and 50, the centers of which are aligned along line A–A'.

Figure 4:
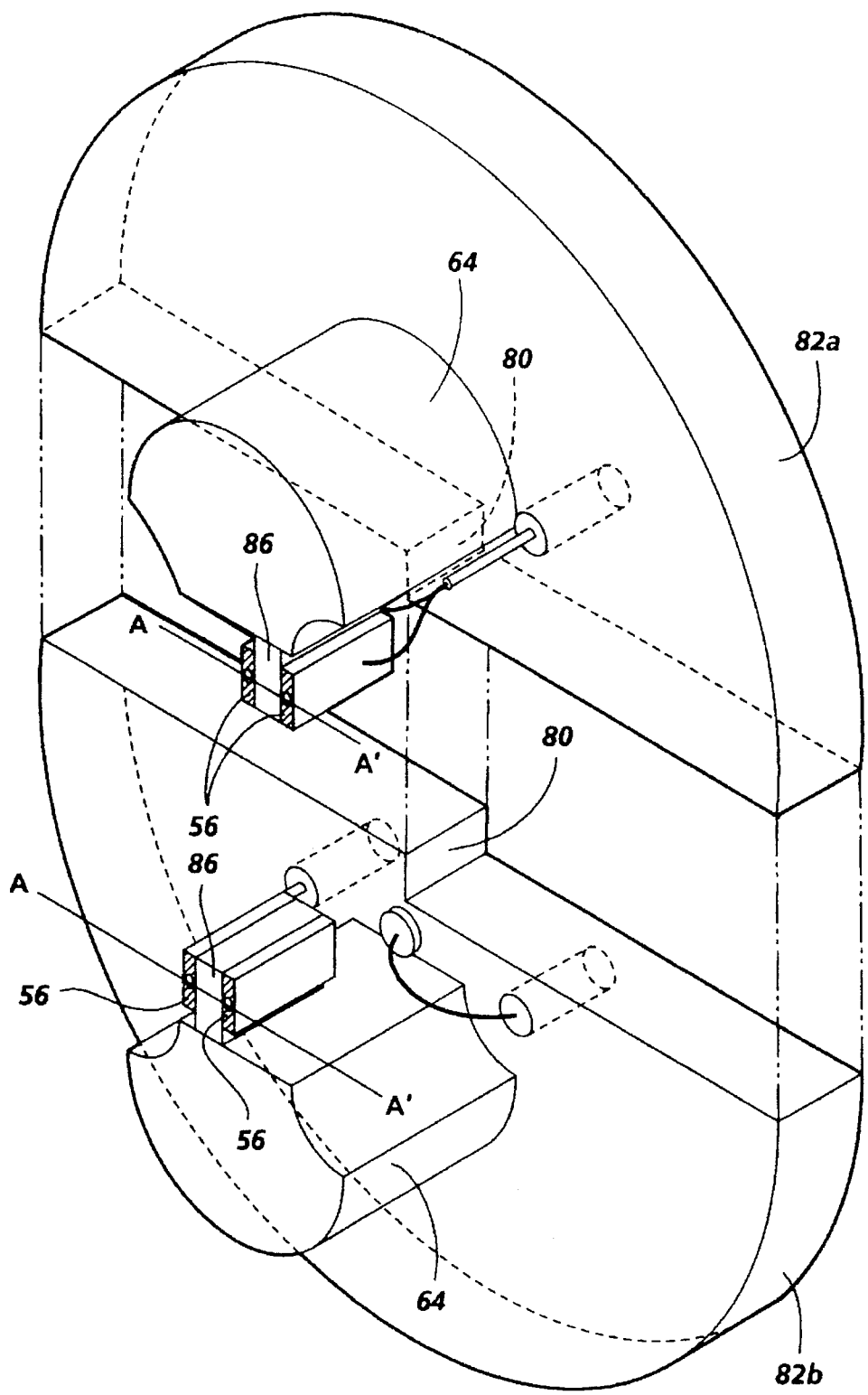
FIG. 4 is another perspective view of the light source illustrating an alternative embodiment of the present invention, wherein a multibeam laser configuration is shown.

Turning now to FIG. 4, which illustrates an alternative embodiment of the present invention, base plates 62, while remaining semicircular in shape, both contain a complimentary step, 80, along the mating surfaces thereof. In this embodiment, the mounts, 82a,b, are assembled in the manner previously described with the interlocking feature being the step. The assembly process for the depicted embodiment would also require a planar surface upon which the backsides of mounts 82a,b would rest during assembly. The planar assembly surface would facilitate the accurate alignment of the mounts so that the emitting faces the four laser diodes, 56, are maintained in or near a common plane as well.

Also depicted in FIG. 4 is a quad-beam diode arrangement, wherein four laser diodes are assembled along a line A–A'. In the quad-beam embodiment, each laser diode is mounted junction side facing a chip carrier, 86, where the chip carrier is bonded to heatsink 64. As described in detail in copending U.S. patent application Ser. No. 07/992,681, now U.S. Pat. No. 5,432,535, by John R. Andrews et al., entitled "Method and Apparatus for Fabrication of Dual Lasers", previously incorporated herein by reference, the chip carrier may be formed from a material suitable for sufficiently reducing thermal cross-talk between the pair of laser diodes affixed thereto. As in the previously described embodiment, the split-base design is commonly used for both of the mount halves, thereby enabling easy access to the laser diodes during manufacture, yet providing a closely spaced laser diode array when assembled.

Figure 5:
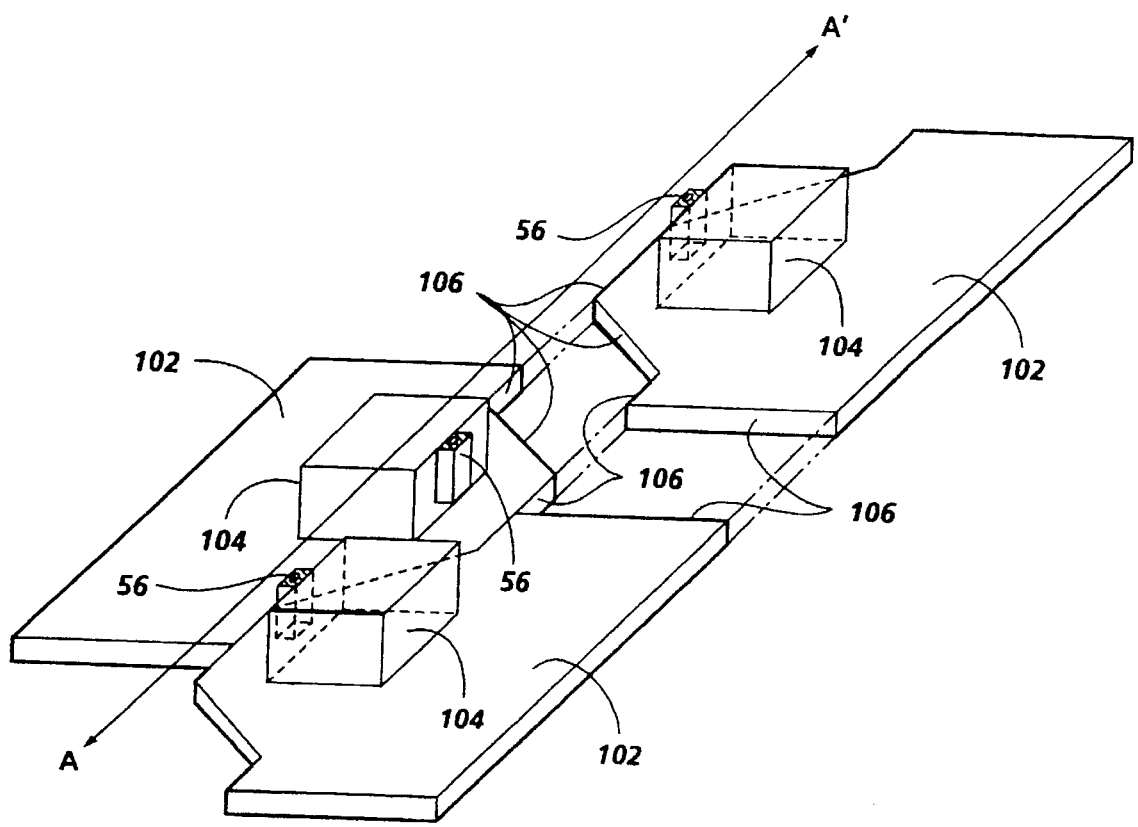
FIG. 5 is yet another perspective view of a multibeam embodiment for the light source of FIG. 2 in accordance with the present invention.

Now considering the multispot embodiment depicted in FIG. 5, the previously described base plate, 102 and heat sink, 104 elements are used once again, but are now arranged in a linear fashion, rather than the previously described two-part, semicircular embodiments. More specifically, the planar base plates, 102, each have one or more mating surfaces 106, which are designed to positively mate with adjoining surfaces of adjacent base plates. While mating surfaces 106 are generally depicted as being orthogonal to the planar surface of the base plate, it would be possible to produce the base plates with all of the mating surfaces consisting of complimentarily angled surfaces (not shown) to further improve the interlocking nature of the plates. Whatever mating surface configuration is chosen, angled or orthogonal, the alignment of the laser diodes along a single line is achieved as a result of the interlocking nature of the base plates, and in response to externally applied forces which tend to push the base plates together. Once held in an aligned relationship, the base plates would be permanently connected to one another using the aforedescribed soldering or equivalent joining operations. FIG. 5 illustrates the potential for a lengthy multispot array, where laser diodes 56 are maintained in an aligned relationship, along line A–A', by the configuration, or shape, of the base plates. Moreover, all the base plates are again of a single, common design, thereby eliminating the need for more than one type of mount to complete the assembly. While not specifically illustrated, it is believed to be apparent, from the embodiment illustrated in FIG. 5 that the present invention may also be used to produce two-dimensional arrays of laser diodes using the previously described alignment features. Such an array would comprise a plurality of laser diodes aligned along at least two lines parallel to the A–A' line illustrated in FIG. 5.

In recapitulation, the present invention is a multispot laser light source assembled from a plurality of individual laser diodes, wherein two or more mounting means, each containing at least one laser diode on a surface thereof, are aligned with one another to produce the multiple spot laser source. The present invention is further characterized by complimentary alignment features, found on the mounting means so as to result in the positive alignment of the mounts and the laser diodes affixed thereto.

It is, therefore, apparent that there has been provided, in accordance with the present invention, a method and apparatus for reliably and efficiently producing a multispot laser device from a plurality of distinct mounting means, wherein the mounting means are all of a common design. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. A multiple spot laser assembly, comprising:
    a plurality of laser diodes, wherein each of said laser diodes emits at least one light beam;
    a plurality of mounts, each of said plurality of mounts including a support surface with a laser diode affixed to the support surface, wherein said mounts are movable with respect to one another and wherein each of said plurality of mounts is identical;
    means for aligning a first one of said plurality of mounts with an adjacent one of said plurality of mounts including means, located on each of said mounts, for interlocking said mounts by contact between a plurality of mating surfaces on said mounts, wherein at least two adjacent surfaces of the plurality of mating surfaces on said mounts form an obtuse angle therebetween and where the interlocking means limits relative motion between adjacent mounts in at least two directions perpendicular to the light beams emitted from said laser diodes, thereby aligning said laser diodes affixed to each of the plurality of mounts while maintaining the support surface of each of said mounts and said laser diodes affixed to the support surface in a spaced apart relationship to avoid thermal crosstalk between the laser diodes; and
    means for joining said plurality of mounts in a permanent fashion.

2. The multiple spot laser assembly of claim 1, wherein each of said plurality of mounts further includes:
    a base plate having said interlocking means incorporated therein; and
    an electrically conductive heat sink, extending above said base plate, having a planar surface for affixing said laser diodes thereto, the planar surface of said heat sink being oriented normal to the base plate, wherein each said heat sink of said plurality of mounts is maintained in an orientation parallel to each other said heat sink upon contact of the plurality of mating surfaces of said mounts, and the light beams emitted from the laser diodes affixed to the planar surface are aligned.

3. The multiple spot laser assembly of claim 2, wherein said base plate includes:
    a planar surface;
    a second surface, opposite said planar surface, having said heat sink extending therefrom; and
    a mating surface, extending between said planar surface and said second surface along at least a portion of a periphery of the base plate, said mating surface including said interlocking means thereon.

4. The multiple spot laser assembly of claim 3, wherein said interlocking means comprises a plurality of non-parallel, adjacent planar sections of said mating surface, arranged at an angle with respect to one another, said interlocking means thereby abutting planar sections of a complimentary interlocking means on the adjacent one of said mounts.

5. The multiple spot laser assembly of claim 1, wherein each of said plurality of mounts includes mating features to control alignment thereof with respect to at least two adjacent mounts, so as to comprise a regularly spaced array of laser diodes.

6. The multiple spot laser assembly of claim 1, wherein each of said plurality of mounts includes coplanar support surfaces having a pair of said laser diodes affixed thereon.

7. The multiple spot laser assembly of claim 1, wherein each of said laser diodes is a single spot laser diode.

8. The multiple spot laser assembly of claim 1, wherein said means for permanently joining said plurality of mounts comprises a fusible alloy which is applied in a molten state.

9. A raster output scanning apparatus for producing a latent electrostatic image by selectively exposing an electrostatically charged surface of a photoresponsive member, comprising:

a multiple spot laser, including:

a first laser diode for producing a first beam, a second laser diode for producing a second beam, first mounting means for supporting the first laser diode such that said first laser diode is mounted on said first mounting means, second mounting means for supporting the second laser diode such that said second laser diode is mounted on said second mounting means, said first mounting means and said second mounting means being independently movable with respect to one another, each of said first mounting means and said second mounting means having a support surface to which a laser diode is affixed and wherein said first mounting means and said second mounting means are identical, and means for aligning said first mounting means with respect to said second mounting means, said aligning means including a plurality of mating surfaces located on each of said first mounting means and said second mounting means, wherein at least two adjacent surfaces of the plurality of mating surfaces located on each of said first mounting means and said second mounting means form an obtuse angle therebetween and where the plurality of mating surfaces provides interlocking alignment between said first mounting means and said second mounting means to limit relative movement therebetween in at least two directions in a plane perpendicular to the first beam and the second beam respectively emitted from said first diode and said second diode when said first mounting means and said second mounting means are placed in contact, said first mounting means and said second mounting means further maintaining the support surface for the first laser diode and the support surface for the second laser diode in a spaced apart relationship when said first mounting means and said second mounting means are placed in contact;

means for joining the first mounting means and the second mounting means in a permanent fashion;

means for deflecting the first beam and the second beam of said multiple spot laser into an optical path; and means for directing the first beam and the second beam of said multiple spot laser toward the electrostatically charged surface of the photoresponsive member to expose regions thereof in order to generate a latent electrostatic image thereon.

10. The apparatus of claim 9, wherein said first mounting means and said second mounting means each include:

a base plate having said mating surface thereon; and an electrically conductive heat sink, extending from the base plate, for supporting said laser diode and dissipating heat generated by said laser diode, so that upon abutting assembly of said first mounting means and said second mounting means the light beams emitted from said first laser diode and said second laser diode are linearly aligned.

11. The apparatus of claim 10, wherein said base plate includes:

a planar surface;

a second surface, opposite said planar surface, having said heat sink extending therefrom; and a mating surface, extending between said planar surface and said second surface along at least a portion of a periphery of the base plate, said mating surface including said mating feature thereon.

12. The apparatus of claim 11, wherein said mating feature on said first mounting means comprises a plurality of non-parallel, adjacent planar sections of said mating surface, arranged at an angle with one another, said mating feature thereby abutting planar sections of a complimentary mating feature on said second mounting means.

* * * * *